United States Patent [19]

Hofer

[11] 3,840,387

[45] Oct. 8, 1974

[54] MASKING PROCESS BY THERMAL REPELLING OF COATING

[75] Inventor: Peter H. Hofer, Berkeley Heights,, N.J.

[73] Assignee: Union Carbide Corporatqon, New York, N.Y.

[22] Filed: May 1, 1973

[21] Appl. No.: 356,201

[52] U.S. Cl. ............... 117/38, 117/155, 117/106 R, 117/161 UH, 117/161 UF, 117/212

[51] Int. Cl. .......................................... C23c 13/04

[58] Field of Search.... 117/106 R, 38, 5.5, 161 UH, 117/161 UF, 212

[56] References Cited

UNITED STATES PATENTS

| | | | |
|---|---|---|---|
| 2,785,997 | 3/1957 | Marvin | 117/212 |
| 2,847,330 | 8/1958 | Toulmin | 117/212 |
| 2,970,064 | 1/1961 | Bolton | 117/5.5 |
| 3,379,803 | 4/1968 | Tittmann et al. | 117/106 R X |
| 3,573,968 | 4/1971 | Loeb et al. | 117/106 R |

*Primary Examiner*—Leon D. Rosdol
*Assistant Examiner*—Harris A. Pitlick
*Attorney, Agent, or Firm*—James J. O'Connell

[57] ABSTRACT

A masking process, during the vapor deposition coating of a partially masked substrate with a condensible vaporous precursor of a coating material, which comprises heating the edges of the masked/unmasked interface of such surface, during the coating process to a temperature at which the condensation of the condensible precursor is completely prevented or substantially retarded so as to prevent any, or any substantial, condensation of such precursor at such interface, and then removing the masking.

8 Claims, 5 Drawing Figures

MASKING PROCESS BY THERMAL REPELLING OF COATING

BACKGROUND OF THE INVENTION

1. Field of the Invention

The invention relates to the coating of partially masked substrates with coatings formed from condensible, vaporous precursors.

2. Description of the Prior Art

Various types of coatings are applied to substrates in a vapor deposition process in which condensible, vaporous precursors of the coating material are caused to condense on, and coat, the surface. One class of such coating materials is the para-xylylene-polymers which are formed from a vaporous diradical which is condensed to form the polymer. These polymers are commonly employed to coat or encapsulate various types of substrates. In some applications, it is necessary to mask defined areas on certain types of substrates in order to prevent the deposition of the coating on such defined areas during the coating operation. Such substrates which must be masked for this purpose include electrical circuitboards, hybrid circuits, and electrical components and modules. It may also be necessary to mask non-electrical substrates which require a masking/demasking operation in conjunction with the use of adhesives in an assemblying operation.

The exposed electrical contacts and connectors on the surface of circuit board substrates must be masked, for example, before the coating operation, and the masking must be removed by mechanical stripping before the coated substrate can then be put to its intended use. The cost incurred heretofore by the masking-/demasking process can account, in many applications, for at least about 20 to 50 percent of the total cost of the coating. Such costs have curtailed, to some extent, the use of these coating materials for various coating applications which could not stand such costs. A more simplified and effective masking process was sought, therefore, in order to expand the field of use of these coating materials.

SUMMARY OF THE INVENTION

It has now been found that a relatively simple and effective masking process is provided when coating a portion of the surface of a substrate with a coating formed from a condensible vaporous precursor by first masking that portion of the surface which is not to be coated, and then, during the coating operation, heating the edges of the masked/unmasked interface of such surface to a temperature at which the condensation of the condensible precursor is completely prevented or substantially retarded so as to prevent any, or any substantial, condensation of such precursor at such interface, and then removing the masking.

An object of the present invention is to provide a masking process which will facilitate the use of coatings formed in a vapor deposition process from a condensible, vaporous precursor to the coating material.

DESCRIPTION OF THE PREFERRED EMBODIMENT

Figure 1:
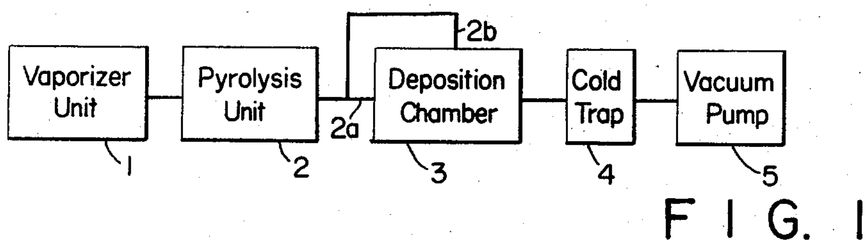
FIG. 1 shows a schematic flow sheet of a p-xylylene polymer coating device arrangement.

The Basic Process of the Present Invention

The basic process of the present invention may be more explicitly defined as a masking process for preventing the bridging, by a condensing coating material during the vapor deposition coating of an unmasked portion of the surface of a substrate with the coating material, of the interface between the unmasked surface of the substrate which is to be coated and the edges of masking means which mask a defined area on the surface of the substrate which is to be maintained free of the coating material during the coating process, which comprises maintaining such interface at a temperature at which the condensation of the condensible precursor is completely prevented or substantially retarded so as to prevent any, or any substantial, deposition of the coating material at such interface.

The preferred coating materials for use in the process of the present invention are linear para-xylylene polymers, and the remaining description of the present invention will be principally based on the use of such polymers in this process.

General Preparation of Para-Xylylene Polymers

Linear para-xylylene polymers are usually prepared by condensing, in a condensation zone, vapors of p-xylylene monomers which can be produced by the pyrolytic cleavage, in a pyrolysis zone, of one or more cyclic dimers represented by the following structure:

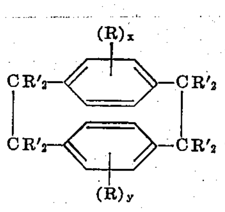

wherein R is an aromatic nuclear substituent, $x$ and $y$ are each integers from 0 to 3, inclusive, and R' is H, Cl and/or F. The thus formed vaporous p-xylylene moiety may be in the form of diradicals having the structures

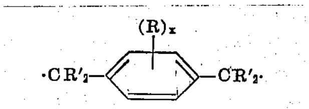

and

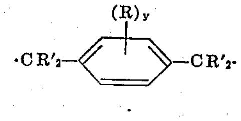

and/or moieties having the tetraene or quinoid structures:

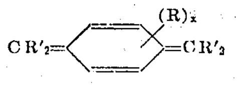

and

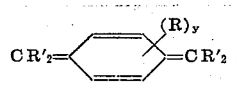

It is believed that the tetraene or quinoid structure is the dominant structure which results when the dimer is pyrolyzed, but that the monomer polymerizes as though it were in the diradical form.

Thus, where *x* and *y* are the same, and the aromatic nuclear substituent on each monomer is the same, and all the R's are the same, two moles of the same p-xylylene monomer are formed, and when condensed, yield a substituted or unsubstituted p-xylylene homopolymer. When *x* and *y* are different or the aromatic nuclear substituents on each p-xylylene monomer are different, or the R's are different, condensation of such monomers will yield copolymers as hereinafter set forth. Examples of the R substituent groups which may be present in the dimers and monomers are organic groups such as alkyl, aryl, alkenyl, cyano, alkoxy, hydroxy alkyl, carbalkoxy and like radicals and inorganic radicals such as hydroxyl, halogen and amino groups. COOH, $NO_2$ and $SO_3H$ groups may be added as R groups to the polymer after it is formed. The unsubstituted positions on the aromatic rings are occupied by hydrogen atoms.

The particularly preferred substituent R groups are the $C_1$ to $C_{10}$ hydrocarbon groups, such as the lower alkyls, i.e., methyl, ethyl, propyl, butyl and hexyl, and aryl hydrocarbons such as phenyl, alkylated phenyl, naphthyl and like groups; and the halogen groups, chlorine, bromine, iodine and fluorine. Hereinafter the term "a di-p-xylylene" refers to any substituted or unsubstituted cyclic di-p-xylylene as hereinabove discussed.

Condensation of the p-xylylene monomers to form the p-xylylene polymers can be accomplished at any temperature below the decomposition temperature of the polymer, i.e., at <250°C. The condensation of the monomers will proceed at a faster rate, the colder is the substrate on which the condensation is to take place. Above certain temperatures, which might be defined as a ceiling condensation temperature, the monomers will condense at rates which are relatively slow for commercial applications. Each has a different ceiling condensation temperature. For example, at 0.5 mm Hg pressure the following condensation and polymerization ceilings are observed for the following monomers:

| | Degrees centigrade |
|---|---|
| p-Xylylene | 25–30 |
| Chloro-p-xylylene | 70–80 |
| Cyano-p-xylylene | 120–130 |
| n-Butyl-p-xylylene | 130–140 |
| Iodo-p-xylylene | 180–200 |

Thus, homopolymers may be made by maintaining the substrate surface at a temperature below the ceiling condensation temperature of the particular monomer species involved, or desired in the homopolymer. This is most appropriately termed "homopolymerizing conditions."

Where several different monomers existing in the pyrolyzed mixture have different vapor pressure and condensation characteristics as for example p-xylylene, or cyano-p-xylylene and chloro-p-xylylene, or any other mixture thereof with other substituted p-xylylenes, homopolymerization will result when the condensation and polymerization temperature is selected to be at or below that temperature at which only one of the monomers condenses and polymerizes. Thus, for the purpose of this invention the term "under homopolymerization conditions" is intended to include those conditions where only homopolymers are formed.

Therefore it is possible to make homopolymers from a mixture containing one or more of the substituted monomers when any other monomers present have different condensation or vapor pressure characteristics, and wherein only one monomer species is condensed and polymerized on the substrate surface. Of course, other monomer species not condensed on the substrate surface can be drawn through the apparatus as hereinafter described in vaporous form to be condensed and polymerized in a subsequent cold trap.

Inasmuch as the p-xylylene monomers, for example, are condensed at temperatures of about 25° to 30°C., which is much lower than that at which the cyano p-xylylene monomers condense, i.e., about 120° to 130°C., it is possible to have such p-xylylene monomers present in the vaporous pyrolyzed mixture along with the cyano-substituted p-xylylene monomers when a homopolymer of the substituted dimer is desired. In such a case, homopolymerizating conditions for the cyano p-xylylene monomers are secured by maintaining the substrate surface at a temperature below the ceiling condensation temperature of the substituted p-xylylene but above that of the unsubstituted p-xylylene; thus permitting the unsubstituted p-xylylene vapors to pass through the apparatus without condensing and polymerizing, but collecting the poly-p-xylylene in a subsequent cold trap.

It is also possible to obtain substituted copolymers through the pyrolysis process hereinabove described. Copolymers of p-xylylene and substituted p-xylylene monomers, as well as copolymers of substituted p-xylylene monomers wherein the substituted groups are all the same radicals but wherein each monomer contains a different number of substituent groups, can all be obtained through such pyrolysis process.

Copolymerization also occurs simultaneously with condensation, upon cooling of the vaporous mixture of reactive monomers to a temperature below about 200°C. under polymerization conditions.

Copolymers can be made by maintaining the substrate surface at a temperature below the ceiling condensation temperature of the lowest boiling monomer desired in the copolymer, such as at room temperature or below. This is considered "copolymerizing conditions," since at least two of the monomers will condense and copolymerize in a random copolymer at such temperature.

In the pyrolytic process, the reactive monomers are prepared by pyrolyzing a substituted and/or unsubstituted di-para-xylylene at a temperature less than about 750°C., and preferably at a temperature between about 600°C. to about 680°C. At such temperatures, essentially quantitative yields of the reactive monomers are secured. Pyrolysis of the starting di-p-xylylene begins at about 450°C. regardless of the pressure employed. Operation in the range of 450°–550°C. serves only to increase the time of reaction and lessen the yield of polymer secured. At temperatures above about 750°C., cleavage of the substituent group can occur, resulting in a tri-/or polyfunctional species causing cross-linking or highly branched polymers.

The pyrolysis temperature is essentially independent of the operating pressure. It is preferred, however that reduced or subatmospheric pressures be employed. For most operations, pressures within the range of 0.0001 to 10 mm Hg absolute are most practical. However, if desired, greater pressures can be employed. Likewise, if desirable, inert vaporous diluents such as nitrogen, argon, carbon dioxide, steam and the like can be employed to vary the optimum temperature of operation or to change the total effective pressure in the system.

When the vapors condense on the substrate to form the polymer, i.e., coating, the coating forms as a continuous film of uniform thickness. The coatings are transparent and pinhole free. The thickness of the coating can be varied by various procedures, as by varying the amount of dimer used, and by varying the reaction temperature, time, pressure and substrate temperature.

In addition to the linear para-xylylene polymers, other coating materials which are usually formed in a vapor deposition process may be used in the process of the present invention.

Masking Means

The masking means which is used in the process of the present invention to mask those areas of the surface of the substrate which are not to be coated include all the conventional masking means, such as masking tape, paper, polyethylene vinyl resins, polytetrafluoroethylene, acetate resin, cellophane, woven tapes, foils, silicone rubber, and laminates made of resins such as epoxy resins, polyester resins and phenolic resins. These laminates may be made with or without structural reinforcing elements.

Adhesives, clamps, clips, spring loaded holders, shrinkfit devices, and the like, may be used to secure the masking means to the surfaces being coated during the coating operation.

The masking means may be used in the form of thin sheets or film which are about 0.0005 to 0.020 inches thick, or in the form of thicker sleeves, templates, and the like. The masking means may be molded or machined to conform to the configuration of the substrate being masked therewith, and they can be reusable.

Heating Element Means

As noted above, the interface of the masked/unmasked surface of the substrate being coated is heated during the coating operation to prevent any substantial deposition of the coating at such interface. The heat necessary for this purpose is more conveniently provided by heating element means.

Such heating element means would include thermal conductors such as strips or wires of aluminum, iron, copper and brass.

The heating element means may also be an electrical conductor or semi-conductor such as an electrical conductor made of copper, aluminum, inconel, nichrome, and tungsten (when used in the absence of air).

The electrical conductors can be heated by applying a voltage therethrough.

The heating element means are relatively thin materials having a diameter or width of about 0.001 inch to 0.010 inch.

The heating element means should be capable of providing the desired range of elevated temperatures.

The heating element means may be an integral part of the surface being coated which either remains on the surface after the removal of the masking means, or is removed by stripping, or is vaporized at elevated temperatures.

Masking Process with Para-Xylylene Polymers

Thus, where a para-xylylene polymer is used as the coating material in the process of the present invention such process may be more specifically defined as a masking process for preventing any, or any substantial, bridging, by para-xylylene polymer during the vapor deposition coating of a substrate surface with said polymer.

of the interface between the surface of said substrate which is to be so coated and the edges of masking means defining an area on said surface which is to be maintained free of said polymer during said coating, which comprises, maintaining said edges at a temperature at which the condensing of the condensible precursor is completely or substantially retarded so as to prevent the deposition of said polymer at said edges.

A more detailed understanding of the masking process of the present invention, in which para-xylylene polymers are employed as the coating materials, may be obtained by now referring to the drawings.

FIG. 1 of the drawings shows a schematic view of various parts of equipment that may be used, in combination, in carrying out the masking process of the present invention. Thus, the vaporization of the p-xylylene dimer is conducted in a vaporizer unit 1. The vapors are then conducted to a pyrolysis unit 2 for the purposes of pyrolyzing the vaporous cyclic dimer to form, per mol of dimer, two mols of the p-xylylene moiety. The p-xylylene vapors are then passed into deposition chamber 3, wherein the novel process of the present invention is essentially conducted. Unreacted p-xylylene vapors pass through deposition chamber 3 into a cold trap 4 where they are condensed. The entire series of elements 1 through 4 is connected in series to vacuum pump 5 which is used to maintain the desired pressure conditions throughout the interconnected system of devices, and also to help cause the dimer and p-xylylene vapors to flow in the desired direction. Valves may be inserted between the adjoining devices in the system to regulate the flow of the vapors.

For the purposes of the present invention the p-xylylene vapors are usually fed to deposition chamber 3 through the side thereof, through line **2*a*, and/or through the top thereof, through line 2*b***.

Figure 2:
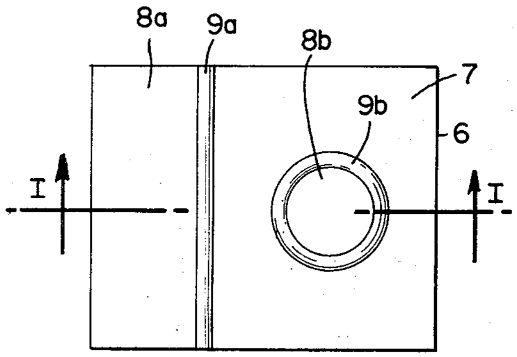
FIG. 2 shows a top view of a circuit board with a portion of the surface thereof masked, and the masked area rimmed with a heating element.

FIG. 2 shows a top view of a circuit board 6 having an upper surface 7. On upper surface 7 there are placed masking means 8a and 8b. These masking means are used to protect the underlying areas of surface 7 from being coated with para-xylylene polymer during the coating operation. Rimming the edges of masking means 8a and 8b are heating element means 9a and 9b. These heating element means thus define the interface between the unmasked areas of surface 7 and the masked areas thereof. Although the total area of surface 7 which is under heating element 8a and 8b is relatively small, it also forms a portion of the area of such surface which is not to be coated. Heating elements 9a and 9b can also be positioned at the base of the edges of masking means 8a and 8b, respectively.

Heating element means 9a and 9b are attached to suitable leads, not shown, for the purposes of supplying the necessary heat to such heating element means.

The surface of circuit board 6 usually contains exposed electrical elements such as electrical connectors, or electrical devices such as diodes, transistors, integrated circuit chips, capacitors, resistors, and the like.

The existence and possible positioning of such electrical elements is not shown since it is not necessary for a proper understanding of the invention. The electrical elements which are to be coated with the coating material, however, are generally positioned within the unmasked areas of surface 7. To avoid coating such exposed electrical elements during the coating process, therefore the surface 7 of circuit board 6 must be masked accordingly, and the configuration of the masking means can be readily tailored to accomplish this end.

Where it is necessary to lay a heating element means over the surface of an exposed electrical element on surface 7, suitable thermal or electrical insulation should be inserted, where necessary, between such exposed electrical elements and the heating element means so as to avoid damaging the exposed electrical elements during the heating of the heating element means.

When masking means 8a and 8b, and heating element means 9a and 9b, are in place on surface 7, and the necessary leads are attached to heating element means 9a and 9b, the thus assembled circuit board is coated with para-xylylene polymer in deposition chamber 3 by allowing p-xylylene dimer vapors to condense and polymerize, as disclosed above, on the exposed surfaces 7 of circuit board 6 and on the surfaces of masking means 8a and 8b. During the coating operation, heating element means 9a and 9b are maintained at a temperature at which either no coating will form because such temperature will be so high that it will completely repel the condensible precursor from the surfaces of the heating element means, or at which the formation of the coating will be substantially retarded due to a substantial repelling of the condensible precursor from the surfaces of the heating element means. No coating will form on the heating element means where the heating element means are heated to a temperature which is about ≥ 5°C. above the ceiling condensation temperature of the vaporous precursors to the coating material. A substantial retardation of the formation of the coating on the heating element means occurs where the growth rate of the condensing coating on the heating element means is about ≤ ½, and preferably about ≤ ¼, the growth rate of the condensing coating on the masked areas of the substrate, at the prevailing conditions of pressure and temperature. A substantial retardation of the formation of the coating can be obtained at temperatures within about ≥5°C., or lower, of the ceiling condensation temperature of the condensible precursor being employed.

For the purposes of the present invention therefore, a coating can be tolerated on the heating element means which is ≤ ½, and preferably ≤ ¼, the thickness of the coating on the masked areas of the substrates. The two coatings (of different thickness) will form one continuous coating with an interface, with respect to the two thicknesses, which is defined by the continuous path of the underlying heating element means. This continuous interface with respect to the two different areas (thick vs. thin) of the continuous coating will still allow the underlying coated heating element means to be readily removed from the coated substrate after the coating operation by applying a shearing force to the coating along such continuous interface between the thicker and thinner areas of the coating and tearing the coating along such interface and removing the underlying heating element means, and the coated masking means. The integrity of the coating on the unmasked areas of coated substrate is not impaired by the removal of the coated heating element means in this manner.

Figure 3:
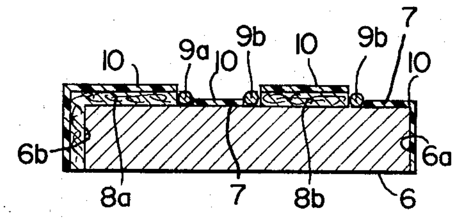
FIG. 3 shows a cross-section of the masked circuit board of FIG. 2, through section I—I thereof, after a coating operation.

FIG. 3 shows a cross-section of circuit board 6 after a coating operation, through section I—I of the circuit board as seen in FIG. 2. The unmasked surface 7 of circuit board 6, and the surfaces of masking means 8a and 8b, are now coated with a continuous coating 10 of poly-para-xylylene. The surfaces of heating elements 9a and 9b are not coated since the coating vapors were completely repelled by the heated elements which were heated during the coating operation to a temperature which was at least 5°C. above the ceiling condensation temperature of the vaporous precursor to the coating material.

In FIG. 3, masking means 8a is shown as also covering a side 6b of circuit board 6. Under the usual coating conditions employed in coating substrates in a vapor deposition process with coating materials such as para-xylylene polymer, all the exposed, unmasked surfaces of the object being coated, top, sides and/or bottom, are usually coated. In the case of circuit board 6, the bottom of it was not coated, since the bottom surface was not exposed to the coating vapors. The unmasked side 6a of circuit board 6 was coated with coating 10 during the coating process, whereas the masked side 6b of the board was only coated on the mask 8a, and not on the side 6b of the board itself.

Masking means 8a and 8b may be much thicker than the diameter of heating element means 9a and 9b, and thus the sides of masking means 8a and 8b which are above heating elements 9a and 9b will also be coated during the coating operation depending on the temperature of the heating element means and the height of the sides of masking means 8a and 8b. Where heating element means 9a and 9b are placed along the base of the edges of masking means 8a and 8b, the sides of such masking means which are above the heating elements will also be coated, again depending on the temperature of the heating elements and the height of the sides of such masking means.

Figure 4:
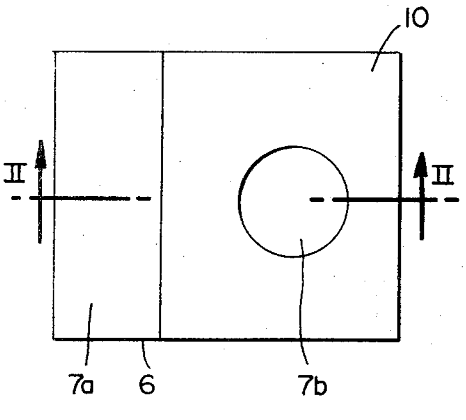
FIG. 4 shows a top view of the circuit board of FIG. 3 after the coating operation, and after the removal of the masking means and heating element.

FIG. 4 shows a top view of circuit board 6, after the coating operation, and after coated masking means 8a and 8b, and heating element means 9a and 9b, have been removed from the coated circuit board.

Figure 5:
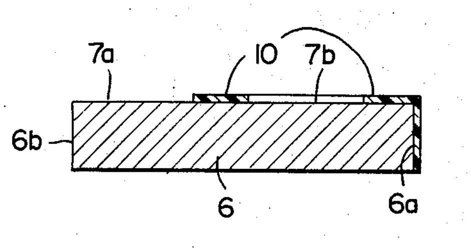
FIG. 5 shows a cross-section of the masked circuit board of FIG. 4, through section II—II thereof.

FIG. 5 shows a cross-section of circuit board 6 through section II—II of the coated, and demasked, circuit board as seen in FIG. 4.

Coating 10 now covers only that portion of surface 7 which was directly exposed to the coating vapors. Surface areas 7a and 7b of circuit board 6 are not coated with para-xylylene polymer, and they are those areas which were respectively covered by masking means 8a and heating element means 9a, and masking means 8b and heating element means 9b.

In all the drawings the relative dimensions of the elements are not drawn to scale in order to readily describe the present invention. In practice, coatings 10 are usually of the order of about 2 to 30 microns thick where para-xylylene polymers are employed as the coating materials. Thicker coatings, of the order of about 100 to 250 microns, may be used with other coating materials.

The process of the present invention can thus be even more specifically defined, with respect to the use of para-xylylene polymer as the coating materials, as, a process for masking a defined area on a substrate during the coating of said substrate with para-xylylene polymer so as to prevent the deposition of said polymer on said defined area during said coating, said defined area having a total area which is less than the area of the substrate being coated, which comprises applying masking means on said defined area so as to cover said defined area, rimming said masking means, at the edges thereof which are on the surface of said substrate, with heat conducting means, heating said heat conducting means to a temperature which is at least ≥ 5°C. above the ceiling condensation temperature of said para-xylylene polymer, and maintaining said substrate at a temperature which is ≤ the ceiling condensation temperature of said polymer, applying to said substrate vapors of para-xylylene dimer whereupon said vapors condense and form said polymer on said substrate and on said masking means but are repelled from the area covered by said heat conducting means.

EXAMPLE

The following example is merely illustrative of the process of the present invention and is not intended as a limitation upon the scope thereof.

This experiment illustrates the present invention. A blank circuit board is masked, coated and demasked in accordance with the present invention. The substrate is a 3 inch × 8 inch × 1/16 inch glass fiber reinforced phenolic resin laminate which is commonly used as a circuit board substrate. The substrate is devoid of any electrical circuitry.

The masking means is a 1 inch wide teflon tape which is 0.004 inch thick, and the heating element means is a 14 inch long inconel wire which is 0.003 inch in diameter.

The masking means had an adhesive backing which allows the masking tape to be adhesively bonded to the substrate.

In the experiment a single width of the tape, i.e., the masking means, is used to mask one of the 3 inch wide ends of the upper surface of the substrate, and the heating element is then positioned continuously adjacent the edge of the masking means on the surface of the substrate, in the positions corresponding to those of masking means 8a and heating element means 9a as shown in FIG. 2 of the drawings. About 5½ inches of the heating element means is allowed to extend beyond each of the top and bottom, as seen in FIG. 2, edges of surface 7 of the circuit board 6. These 5 ½ inch leads are attached, in a para-xylylene polymer coating deposition chamber, to a variac (without an in-line transformer) source of electricity. Electric current is supplied to the heating element during the coating operation so as to heat the wire to a temperature of about 260°C., at a voltage of 15 volts and an amperage of 0.62 amperes. At a higher voltage (16.0 volts and 0.64 amperes) the wire is heated to about 300°C. While the heating element is so heated, in the deposition chamber, the masked substrate is coated with a coating of poly-chloro-para-xylylene which provides about a 0.0005 to 0.0007 inch thick coating on the masked and unmasked surfaces of the substrate, although no coating forms on the heated heating element. The vaporous diradical precursor to the polymeric coating is repelled from the surface of the heated heating element.

The coating is supplied by charging about 35 grams of chloro-para-xylylene monomer to a vaporizer unit and vaporizing and pyrolyzing the monomer, and condensing the resulting diradical on the substrate being coated in the deposition chamber, as described above. During the coating operation the following conditions prevail in the coating apparatus:

| | | |
|---|---|---|
| vaporizer unit temperature | : | 200°C. |
| pyrolysis unit temperature | : | 650°C. |
| deposition chamber pressure | : | 30–90 microns |
| cold trap temperature | : | −86°C. |
| vacuum pump | : | 3 microns |

After the coating operation, the leads from the heating element are disconnected from their source of electricity and the coated substrate is removed from the deposition chamber. The heating element is then removed from the substrate leaving a continuous uncoated path in the polymeric coating, in the space occupied by heating element 9a as seen in FIGS. 2 and 3, which is about twice the width of the heating element. The coated masking means is then stripped from the substrate leaving the unmasked areas of the substrate coated with a continuous coating, as shown in FIGS. 4 and 5. The adhesion of the remaining coating, to the unmasked substrate, is not impaired by the heating of the heating element.

What is claimed is:

1. A process for preventing any, or any substantial, bridging, by a condensing coating material during the vapor deposition coating of an unmasked portion of the surface of a substrate with said coating material, of the interface between the unmasked surface of said substrate and the edges of masking means which mask an area on said surface which is to be maintained free of said coating material during said coating, which comprises maintaining said interface at a temperature at which the condensation of the coating material is completely prevented or substantially retarded during said coating process so as to prevent any, or any substantial, deposition of said coating material at said interface.

2. A process as in claim 1 in which said interface is maintained at a temperature at which condensation is completely prevented.

3. A process as in claim 2 in which said coating material comprises linear para-xylylene polymer which is formed by the condensation of para-xylylene diradical precursor.

4. A process as in claim 3 in which said coating material comprises poly-chloro-para-xylylene.

5. A process for preventing any, or any substantial, bridging, by para-xylylene polymer during the vapor deposition coating of a substrate surface with said polymer, of the interface between the surface of said substrate which is to be so coated and the edges of masking means defining an area on said surface which is to be maintained free of said polymer during said coating, which comprises, maintaining said interface at a temperature at which the condensation of the condensible para-xylylene diradical precursor to said polymer is completely prevented or substantially retarded during said coating process so as to prevent any, or any substantial, deposition of said polymer at said interface.

6. A process for masking a defined area on a substrate during the coating of said substrate with para-xylylene polymer so as to prevent the deposition of said polymer on said defined area during said coating, said defined area being less than the total coatable area of the substrate being coating, which comprises applying masking means to said defined area so as to cover said defined area, rimming said masking means, at the edges thereof which are on the surface of said substrate, with heat conducting means, heating said heat conducting means to a temperature which is at least $\geq 5°C$. above the ceiling condensation temperature of said para-xylylene polymer, and maintaining said substrate at a temperature which is $\leq$ the ceiling condensation temperature of said polymer, applying to said substrate vapors of para-xylylene dimer whereupon said vapors condense and form said polymer on said substrate and on said masking means but are repelled from the area covered by said heat conducting means, and removing said masking means and said heat conducting means from said substrate.

7. A process as in claim 6 in which said para-xylylene polymer comprises poly-chloro-para-xylylene.

8. A process as in claim 6 in which said heat conducting means comprises an electrical conductor.

* * * * *

)-1050
)/69)

UNITED STATES PATENT OFFICE
CERTIFICATE OF CORRECTION atent No. 3,840,387 Dated October 8, 1974 nventor(s) Peter H. Hofer

It is certified that error appears in the above-identified patent nd that said Letters Patent are hereby corrected as shown below:

Column 8, line 5, "≥5°C" should read --±5°C--.

Signed and sealed this 18th day of February 1975.

(SEAL)
Attest:

RUTH C. MASON
Attesting Officer

C. MARSHALL DANN
Commissioner of Patents
and Trademarks